US012684799B2

(12) United States Patent
    Lin et al.

(10) Patent No.:     US 12,684,799 B2
(45) **Date of Patent:        \*Jul. 14, 2026**

(54) MULTI-GATE DEVICE FABRICATION AND STRUCTURES THEREOF

(71) Applicant: Taiwan Semiconductor Manufacturing Company, Ltd., Hsinchu (TW)

(72) Inventors: Chien-Chih Lin, Taichung City (TW); An Chyi Wei, Hsin-Chu City (TW); Hsiu-Hao Tsao, Taichung (TW); Shih-Hao Lin, Hsinchu (TW); Szu-Chi Yang, Hsinchu City (TW); Chang-Jhih Syu, Hsinchu (TW); Yu-Jiun Peng, Hsinchu (TW)

(73) Assignee: TAIWAN SEMICONDUCTOR MANUFACTURING COMPANY, LTD., Hsinchu (TW)

( \* ) Notice: Subject to any disclaimer, the term of this patent is extended or adjusted under 35 U.S.C. 154(b) by 69 days.

This patent is subject to a terminal disclaimer.

(21) Appl. No.: 18/674,285

(22) Filed: May 24, 2024

(65) Prior Publication Data

US 2024/0313090 A1      Sep. 19, 2024

Related U.S. Application Data

(63) Continuation of application No. 17/465,766, filed on Sep. 2, 2021, now Pat. No. 11,996,468.

(Continued)

(51) Int. Cl.
    H10D 30/01          (2025.01)
    H10D 30/67          (2025.01)
    (Continued)

(52) U.S. Cl.
    CPC ....... H10D 30/031 (2025.01); H10D 30/6735 (2025.01); H10D 30/6757 (2025.01);
    (Continued)

(58) Field of Classification Search
    CPC .... H10D 30/797; H10D 30/30; H10D 62/121; H10D 64/015; H10D 64/685;
    (Continued)

(56)                References Cited

U.S. PATENT DOCUMENTS 8,796,666 B1      8/2014   Huang
8,815,712 B2      8/2014   Wan
                  (Continued)

FOREIGN PATENT DOCUMENTS

TW          202008512 A        2/2020

*Primary Examiner* — Jasmine J Clark
(74) *Attorney, Agent, or Firm* — Haynes and Boone, LLP

(57)                ABSTRACT

A method of fabricating a device includes providing a fin having an epitaxial layer stack with a plurality of semiconductor channel layers interposed by a plurality of dummy layers. In some embodiments, the method further includes exposing lateral surfaces of the plurality of semiconductor channel layers and the plurality of dummy layers within a source/drain region of the semiconductor device. In some examples, the method further includes etching the exposed lateral surfaces of the plurality of dummy layers to form recesses and forming an inner spacer within each of the recesses, where the inner spacer includes a sidewall profile having a convex shape. In some cases, and after forming the inner spacer, the method further includes performing a sheet trim process to tune the sidewall profile of the inner spacer such that the convex shape of the sidewall profile becomes a substantially vertical sidewall surface after the sheet trim process.

20 Claims, 10 Drawing Sheets

Related U.S. Application Data

(60) Provisional application No. 63/176,119, filed on Apr. 16, 2021.

(51) Int. Cl.

| | | |
|---|---|---|
| *H10D 62/10* | (2025.01) | |
| *H10D 64/01* | (2025.01) | |
| *H10P 14/20* | (2026.01) | |
| *H10P 50/24* | (2026.01) | |
| *H10P 70/00* | (2026.01) | |

(52) U.S. Cl.
CPC ......... *H10D 62/118* (2025.01); *H10D 64/017* (2025.01); *H10D 64/018* (2025.01); *H10P 14/3452* (2026.01); *H10P 50/242* (2026.01); *H10P 70/20* (2026.01)

(58) Field of Classification Search
CPC ...... H10D 62/82; H10D 62/822; B82Y 10/00; H01L 21/31116; H01L 21/02057; H01L 21/0259; H01L 21/3065; H01L 29/0665; H01L 29/42392; H01L 29/66545; H01L 29/66553; H01L 29/78696

USPC ......................................................... 438/157

See application file for complete search history.

(56) References Cited

U.S. PATENT DOCUMENTS

| | | | |
|---|---|---|---|
| 8,963,258 B2 | 2/2015 | Yu | |
| 9,093,530 B2 | 7/2015 | Huang | |
| 9,171,929 B2 | 10/2015 | Lee | |
| 9,214,555 B2 | 12/2015 | Oxland | |
| 9,236,267 B2 | 1/2016 | De | |
| 9,520,482 B1 | 12/2016 | Chang | |
| 9,548,303 B2 | 1/2017 | Lee | |
| 11,296,082 B2 | 4/2022 | Chuang | |
| 11,996,468 B2 * | 5/2024 | Lin | H01L 29/78696 |
| 2013/0285116 A1 | 10/2013 | Lochtefeld | |
| 2022/0285533 A1 | 9/2022 | Lee | |

* cited by examiner

200

PROVIDE A SUBSTRATE INCLUDING A PARTIALLY FABRICATED DEVICE 202

FORM INNER SPACERS AND SOURCE/DRAIN FEATURES 204

REMOVE DUMMY GATES 206

RELEASE CHANNEL LAYERS 208

PERFORM SHEET TRIM PROCESS 210

FORM GATE STRUCTURE 212

FORM SOURCE/DRAIN CONTACTS 214

MULTI-GATE DEVICE FABRICATION AND STRUCTURES THEREOF

CROSS-REFERENCE TO RELATED APPLICATION

This application is a continuation of U.S. patent application Ser. No. 17/465,766, filed Sep. 2, 2021, issuing as U.S. Pat. No. 11,996,468, which claims the benefit of U.S. Provisional Application No. 63/176,119, filed Apr. 16, 2021, the entireties of which are incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs. In general, GAA transistors may be implemented, for example, in cases where FinFETs can no longer meet performance requirements. However, fabrication of GAA transistors has introduced new challenges to the semiconductor manufacturing process and has led to associated device reliability concerns. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
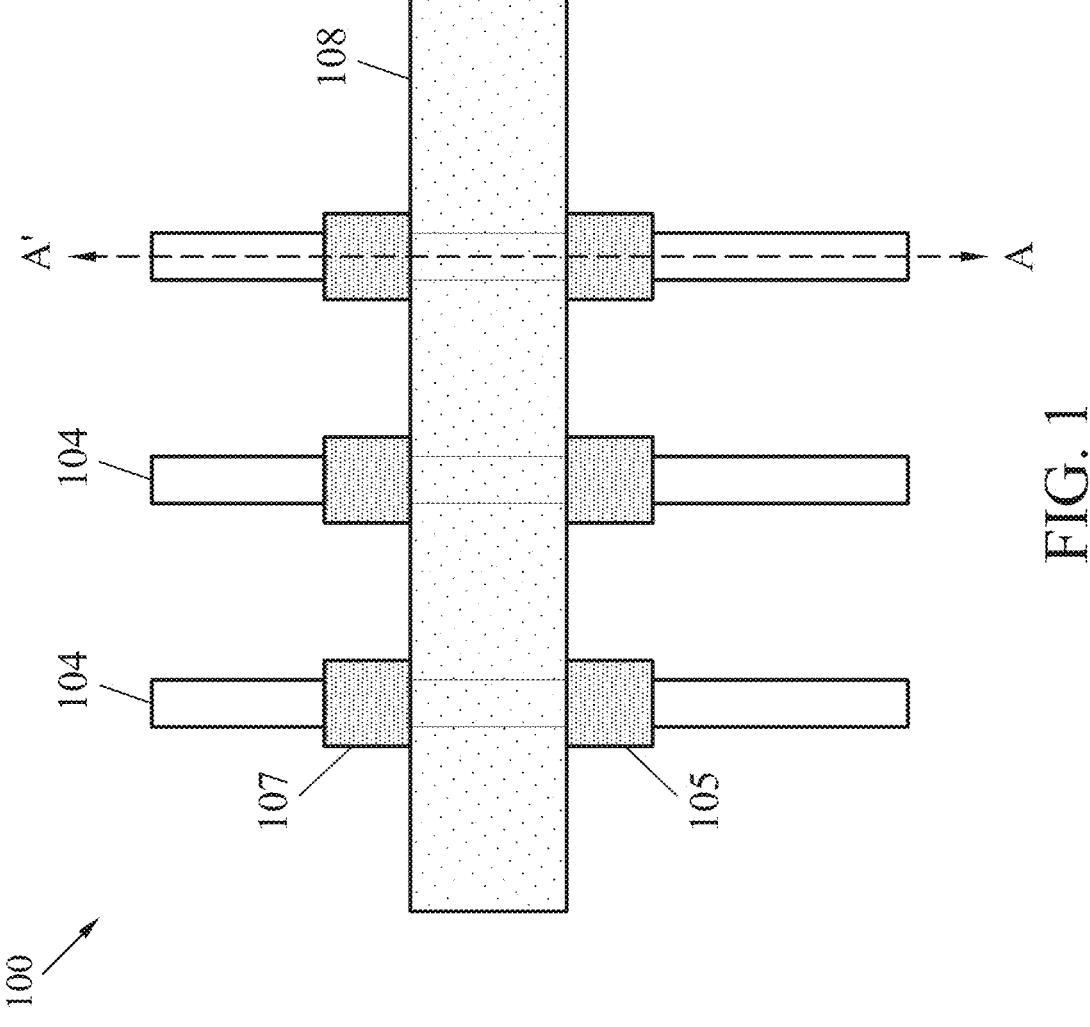
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

For multi-gate devices, such as GAA devices, an inner metal gate profile and an inner spacer profile are critical for both device performance and yield. In at least some existing implementations, the convex sidewall profile of the inner spacer that interfaces a corresponding concave sidewall profile of a metal gate structure may contribute to non-uniform metal gate critical dimension (CD) and inner spacer thickness, which may cause reduced drive current and increased resistance. Such a device configuration may also result in a reduced process window for final metal gate CD control. In some cases, an incoming SiGe sacrificial layer profile (the SiGe sacrificial layer being subsequently replaced by the metal gate structure) may also be impacted by surface impurities, well doping concentration, and geometry effects. As a result, the final metal gate structure may likewise suffer from impurities and/or other defects, reducing device performance.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for modulating a final metal gate and inner spacer profile of a multi-gate device (e.g., such as a GAA transistor), which would crucially affect the device and yield performance, thereby overcoming various existing challenges. In some examples, a method of modulating a final inner metal gate profile during a replacement poly gate (RPG) sheet formation process is provided. In various embodiments, and prior to formation of the metal gate, the convex sidewall profile of the inner spacer may be tuned using a sheet trim process. Generally, the disclosed sheet trim process may include an ozonated deionized water ($DIO_3$) wet clean followed by a dry, plasma-free etching process. In some embodiments, the sheet trim process is designed such that a middle portion of the convex inner spacer is consumed faster than top or bottom portions of the convex inner spacer such that the convex inner spacer profile becomes flattened (e.g., defining a substantially vertical plane surface). As a result of the sheet trim process and modification of the inner spacer profile, the subsequently formed metal gate will have a profile that is substantially square in shape (e.g., after IL/HK and work function metal deposition). It is further noted that the sheet trim process may also provide for the inner spacer to have a more uniform width (e.g., from top to bottom of the inner spacer) while also increasing and providing a more uniform metal gate CD. The various embodiments thus provide for improved device performance (e.g., such as increased drive current, reduced DIBL, and reduced channel resistance), a wider process window for final metal gate CD control, and reduced defects, among others. Stated another way, the embodiments disclosed herein provide a tunable process to modulate a metal gate CD and metal gate profile/inner spacer profile both for device performance and yield window enhancement. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
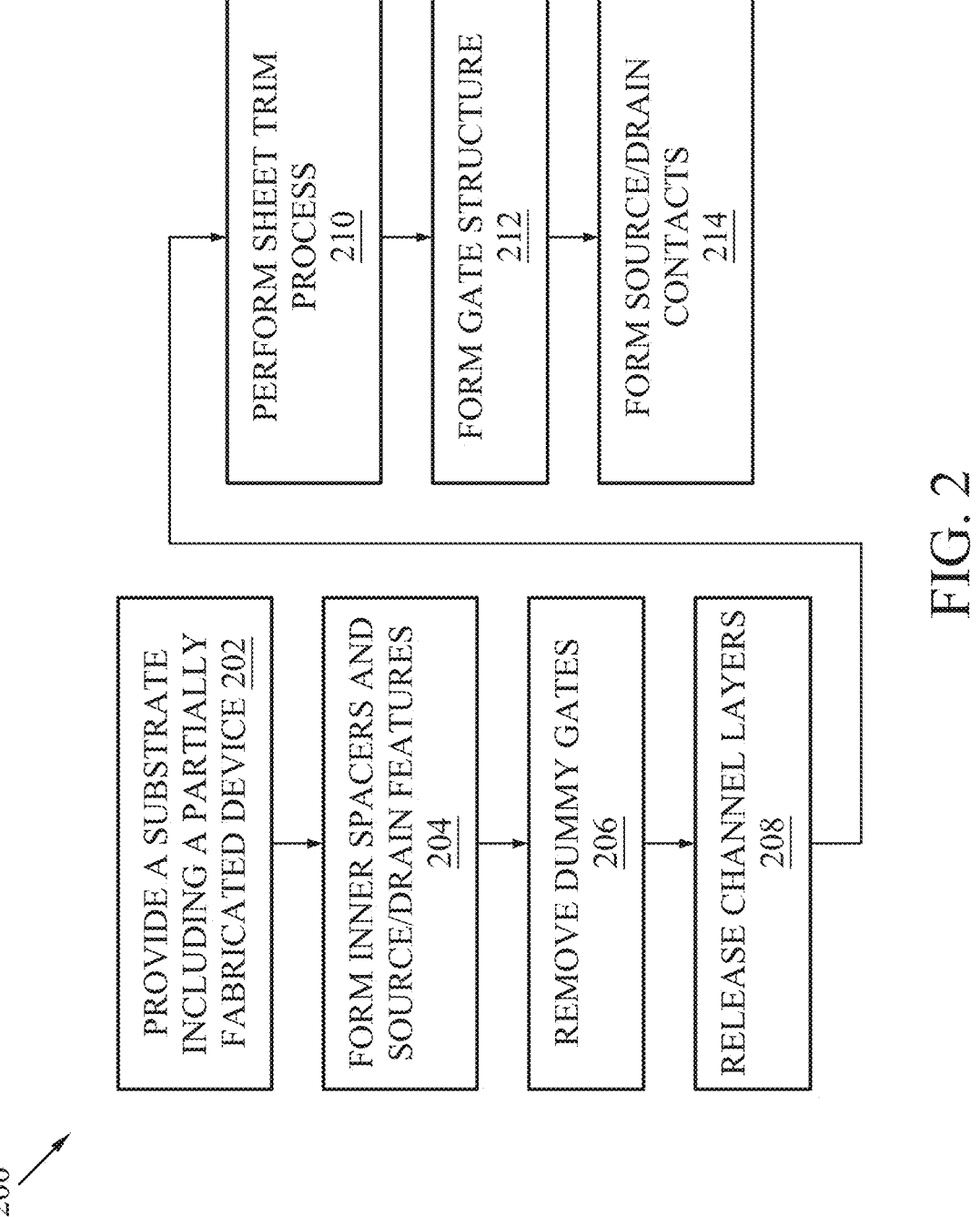
FIG. 2 is a flow chart of a method of fabricating a semiconductor device 300 according to one or more aspects of the present disclosure.

Referring to FIG. 2, illustrated therein is a method 200 of semiconductor fabrication including fabrication of a semiconductor device 300 (e.g., which includes a multi-gate device), in accordance with various embodiments. The method 200 is discussed below with reference to fabrication of GAA transistors. However, it will be understood that aspects of the method 200 may be equally applied to other types of multi-gate devices, or to other types of devices implemented by the multi-gate devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is further noted that, in some embodiments, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 include a plurality of semiconductor devices (e.g., transistors) which may be interconnected. Moreover, it is noted that the process steps of method 200, including any descriptions given with reference to the figures are merely exemplary and are not intended to be limiting beyond what is specifically recited in the claims that follow.

Figures 4, 4A:
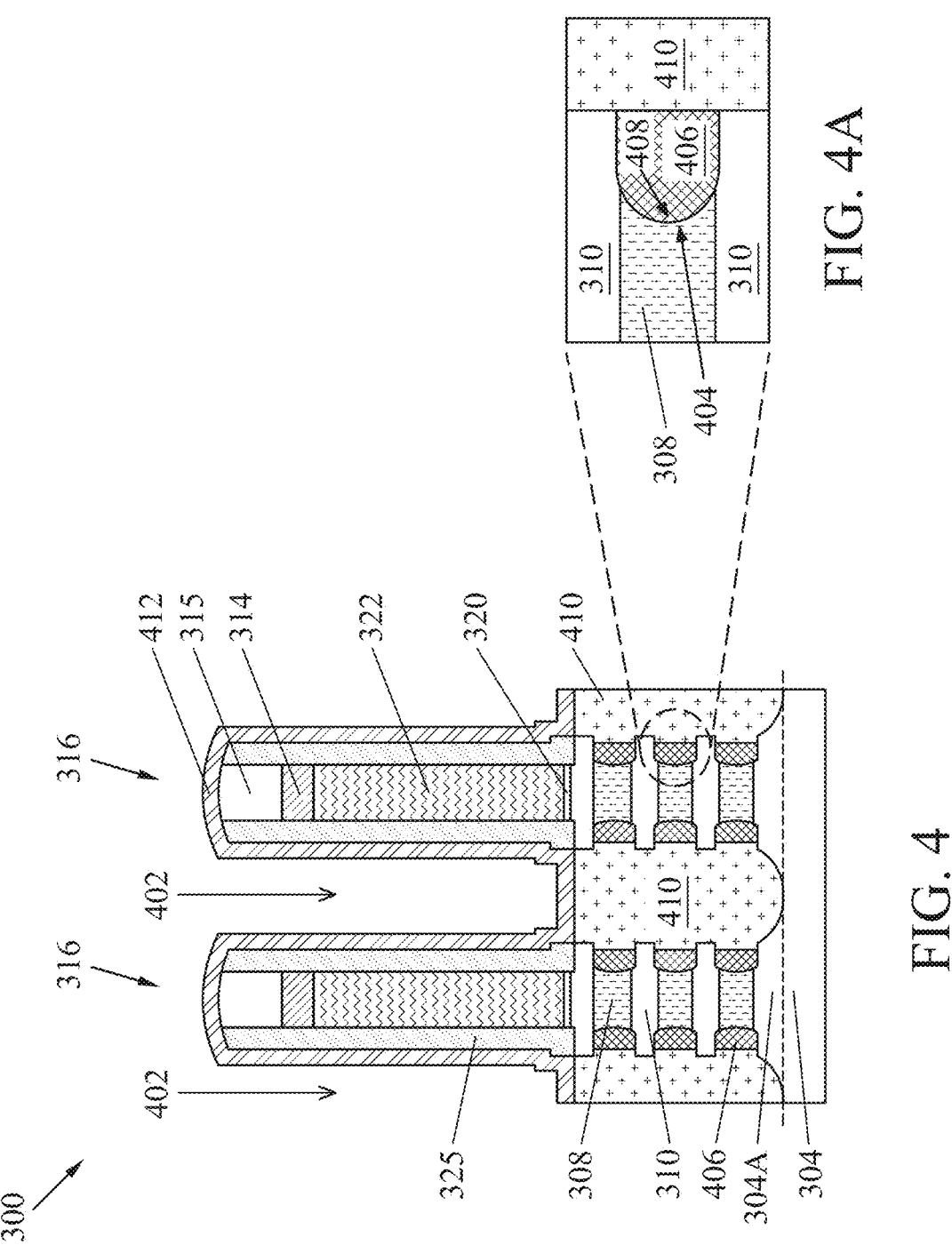
FIG. 4A provides an enlarged view of a portion of the semiconductor device 300 of FIG. 4, in accordance with some embodiments.
Figure 5:
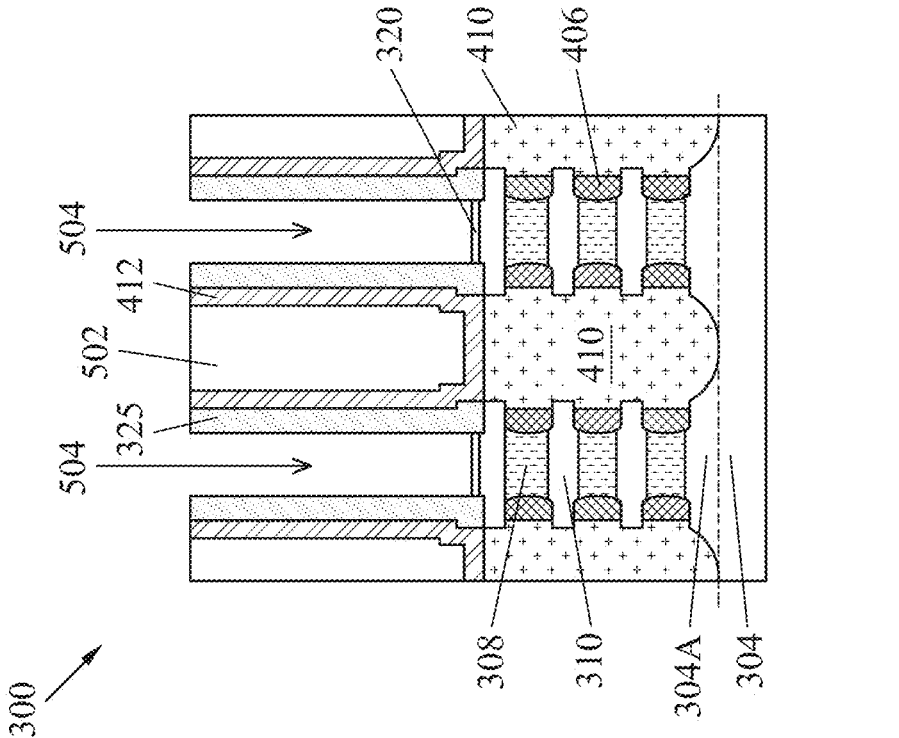
Figures 6, 6A:
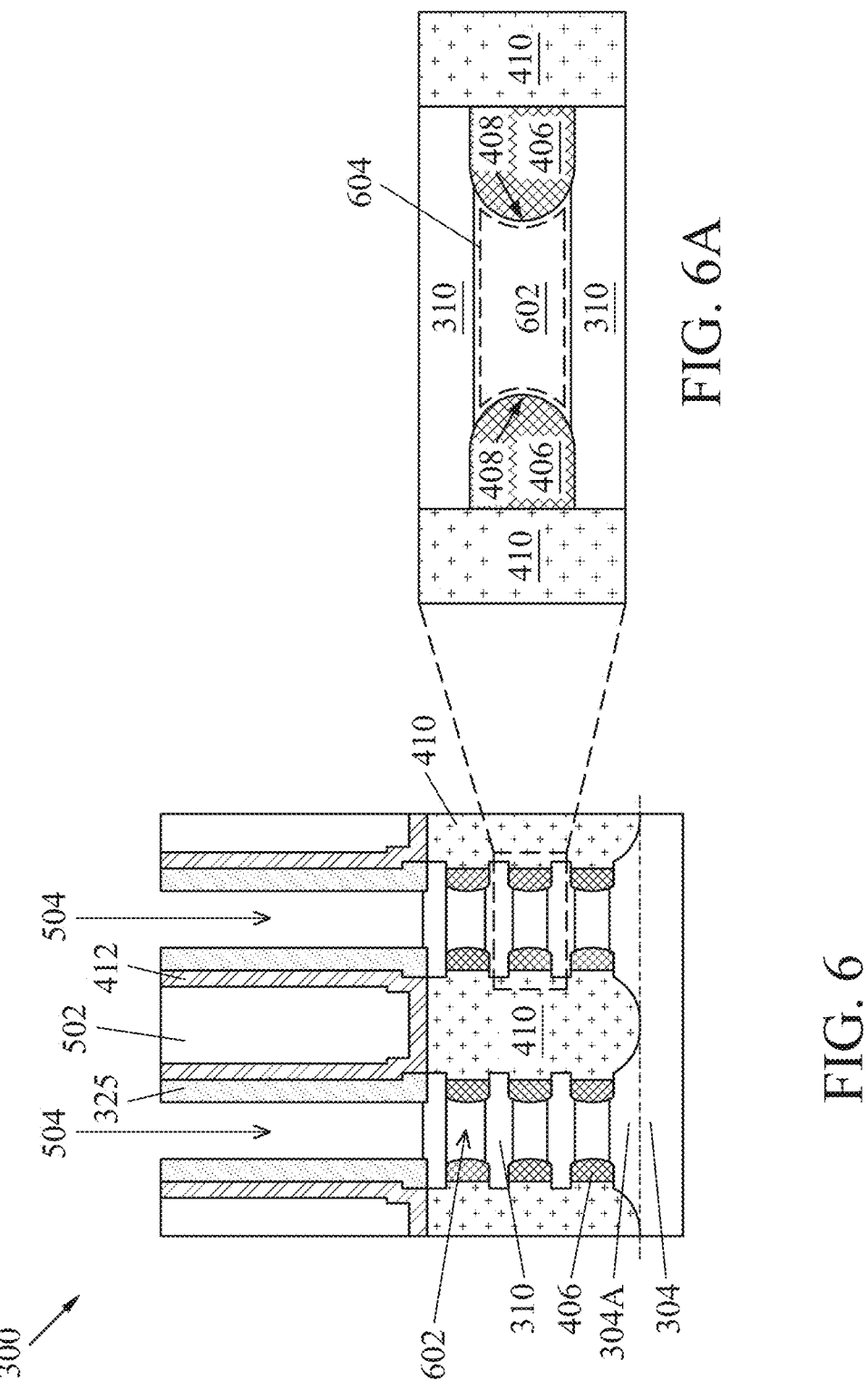
FIG. 6A provides an enlarged view of a portion of the semiconductor device 300 of FIG. 6, in accordance with some embodiments.
Figures 7, 7A, 7B, 7C:
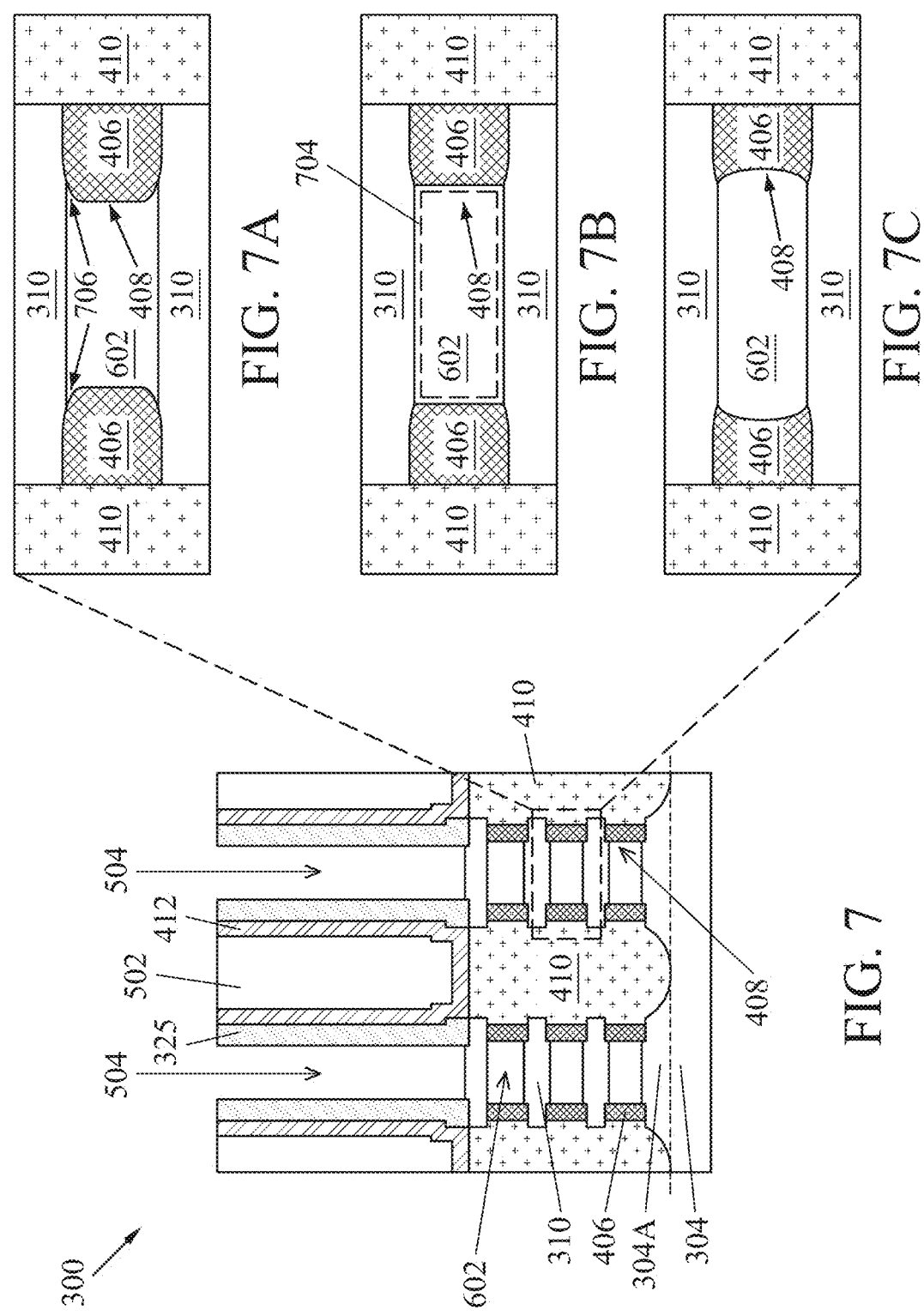
FIGS. 7A, 7B, and 7C provide enlarged views of a portion of the semiconductor device 300 of FIG. 7, showing various examples of inner spacer sidewall profiles after a sheet trim process, in accordance with some embodiments.
Figure 8A:
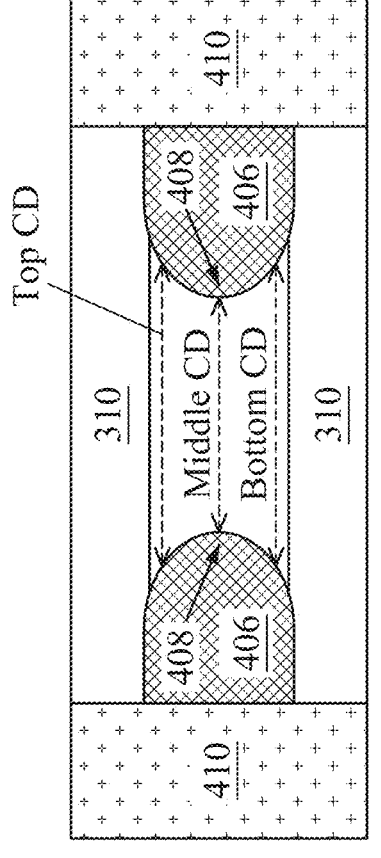
FIGS. 8A and 8B provide enlarged views of a portion of the semiconductor device 300, before and after a sheet trim process and illustrating a change in critical dimension (CD), in accordance with some embodiments.
Figure 8B:
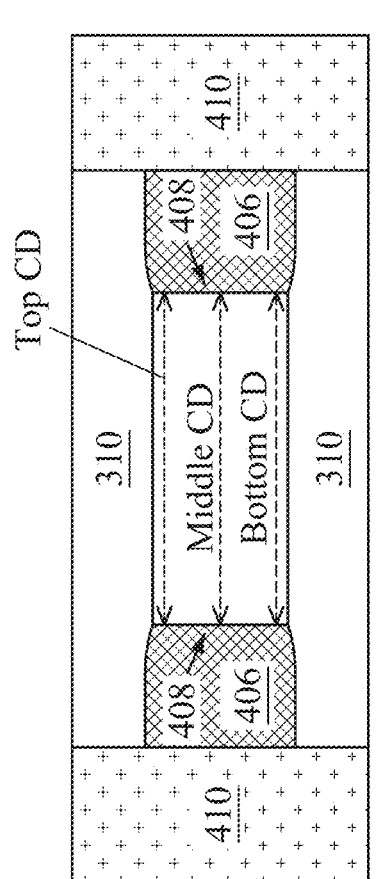

The method 200 begins at block 202 where a substrate including a partially fabricated device is provided. Referring to the example of FIG. 3, in an embodiment of block 202, a partially fabricated device 300 is provided. FIGS. 3, 4, 5, 6, 7, 9, and 10 provide cross-sectional views of an embodiment of the semiconductor device 300 along a plane substantially parallel to a plane defined by section AA' of FIG. 1 (e.g., along the direction of a fin 306). FIG. 4A provides an enlarged view of a portion of the semiconductor device 300 of FIG. 4, FIG. 6A provides an enlarged view of a portion of the semiconductor device 300 of FIG. 6, FIGS. 7A, 7B, and 7C provide enlarged views of a portion of the semiconductor device 300 of FIG. 7, showing various examples of inner spacer sidewall profiles after a sheet trim process, and FIGS. 8A and 8B provide enlarged views of a portion of the semiconductor device 300, before and after a sheet trim process and illustrating a change in CD.

The device 300 may be formed on a substrate 304. In some embodiments, the substrate 304 may be a semiconductor substrate such as a silicon substrate. The substrate 304 may include various layers, including conductive or insulating layers formed on a semiconductor substrate. The substrate 304 may include various doping configurations depending on design requirements as is known in the art. The substrate 304 may also include other semiconductors such as germanium, silicon carbide (SiC), silicon germanium (SiGe), or diamond. Alternatively, the substrate 304 may include a compound semiconductor and/or an alloy semiconductor. Further, the substrate 304 may optionally include an epitaxial layer (epi-layer), may be strained for performance enhancement, may include a silicon-on-insulator (SOI) structure, and/or have other suitable enhancement features.

Figure 3:
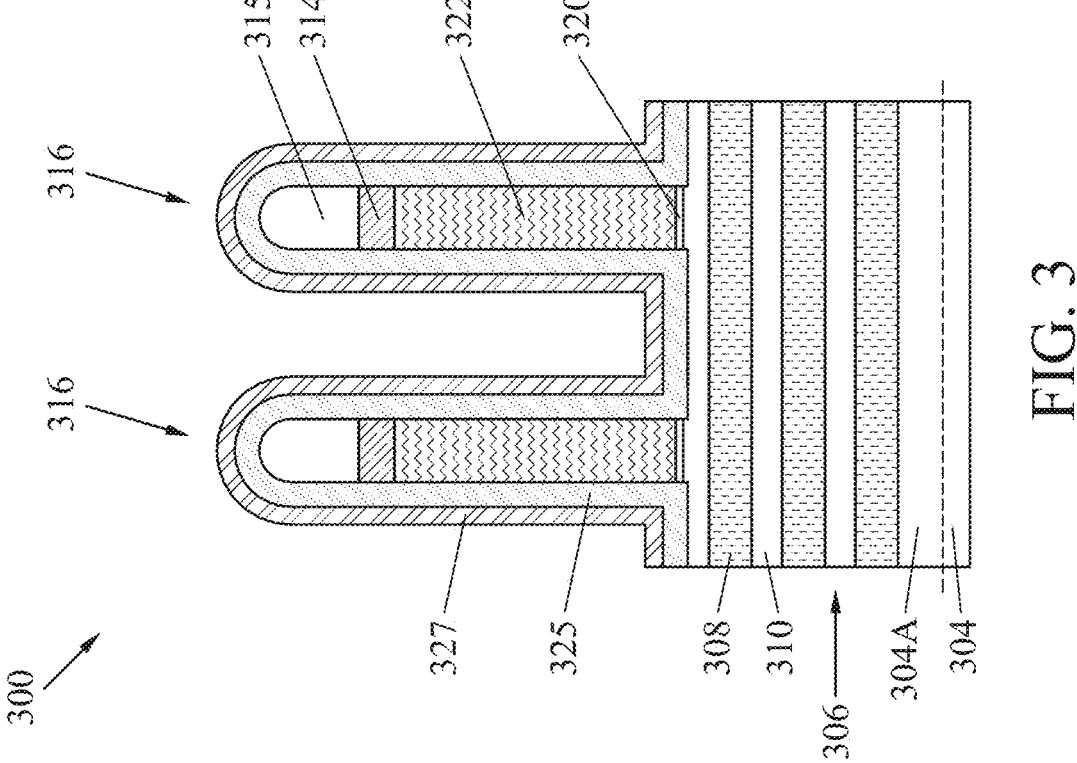
FIGS. 3, 4, 5, 6, 7, 9, and 10 provide cross-sectional views of an embodiment of the semiconductor device 300 along a plane substantially parallel to a plane defined by section AA' of FIG. 1, in accordance with some embodiments.

As shown in FIG. 3, the device 300 includes the fin 306 having a substrate portion 304A (formed from the substrate 304), epitaxial layers 308 of a first composition and epitaxial layers 310 of a second composition that interpose the layers 308 of the first composition. In some cases, shallow trench isolation (STI) features may be formed to isolate the fin 306 from neighboring fins. For purposes of this discussion, the epitaxial layers 308 of the first composition include dummy layers, and the epitaxial layers 310 of the second composition include semiconductor channel layers. In an embodiment, the epitaxial layers 308 of the first composition include SiGe and the epitaxial layers of the second composition 310 include silicon (Si). It is also noted that while the layers 308, 310 are shown as having a particular stacking sequence within the fin 306, where the layer 310 is the topmost layer of the stack of layers 308, 310, other configurations are possible. For example, in some cases, the layer 308 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure.

In various embodiments, the epitaxial layers 310 (e.g., including the second composition), or portions thereof, may form a channel region of a GAA transistor of the device 300. For example, as noted above, the layers 310 may be referred to as semiconductor channel layers that are used to form a channel region of a GAA transistor. In various embodiments, the semiconductor channel layers (e.g., the layers 310 or portions thereof) may include nanosheet channel(s), nanowire channel(s), bar-shaped channel(s), and/or other suitable channel configurations. The semiconductor channel layers may also be used to form portions of the source/drain features of the GAA transistor, in some embodiments.

It is noted that while the fin 306 is illustrated as including three (3) layers of the epitaxial layer 308 and three (3) layers of the epitaxial layer 310, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some embodiments, the number of epitaxial layers 310, and thus the number of semiconductor channel layers, is between 3 and 10.

In some embodiments, the epitaxial layers 308 (the dummy layers) each have a thickness in a range of about 5-15 nanometers (nm). In some cases, the epitaxial layers 310 (the semiconductor channel layers) each have a thickness in a range of about 5-15 nm. As noted above, the epitaxial layers 310 may serve as channel region(s) for a subsequently-formed multi-gate device (e.g., a GAA transistor) and its thickness may be chosen based at least in part on device performance considerations. The epitaxial layers 308 may serve to define a gap distance between adjacent channel region(s) for the subsequently-formed multi-gate device and its thickness may also be chosen based at least in part on device performance considerations.

The device 300 further includes gate stacks 316 formed over the fin 306. In an embodiment, the gate stacks 316 are dummy (sacrificial) gate stacks that are subsequently removed and replaced by a final gate stack at a subsequent processing stage of the device 300. For example, the gate stacks 316 may be replaced at a later processing stage by a high-K dielectric layer (HK) and metal gate electrode (MG). While the present discussion is directed to a replacement gate (gate-last) process whereby a dummy gate structure is formed and subsequently replaced, other configurations may be possible (e.g., such as a gate-first process). The portion of the fin 306 underlying the gate stacks 316 may be referred to as the channel region of the device 300. The gate stacks 316 may also define a source/drain region of the fin 306, for example, the regions of the fin 306 adjacent to and on opposing sides of the channel region.

In some embodiments, the gate stacks 316 include a dielectric layer 320 and an electrode layer 322 over the dielectric layer 320. The gate stacks 316 may also include one or more hard mask layers 314, 315. In some embodiments, the hard mask layer 314 may include a nitride layer, and the hard mask layer 315 may include an oxide layer. In some embodiments, the dielectric layer 320 includes silicon oxide. Alternatively, or additionally, the dielectric layer 320 may include silicon nitride, a high-K dielectric material or other suitable material. In some embodiments, the electrode layer 322 may include polycrystalline silicon (polysilicon). In some embodiments, the nitride of the hard mask layer 314 includes a pad nitride layer that may include $Si_3N_4$, silicon oxynitride or silicon carbide. In some embodiments, the oxide of the hard mask layer 315 includes a pad oxide layer that may include $SiO_2$.

In some embodiments, and after formation of the gate stacks 316, one or more spacer layers 325, 327 may be conformally deposited over the device 300. The spacer layers 325, 327 may be deposited over and on sidewalls of the gate stacks 316. In some cases, the spacer layers 325, 327 may have a total thickness of about 2-10 nm. In some cases, the spacer layers 325, 327 may include a dielectric material such as silicon oxide, silicon nitride, silicon carbide, silicon oxynitride, SiCN, silicon oxycarbide, SiOCN, a low-K material (e.g., with a dielectric constant 'k' <7), and/or combinations thereof. In some embodiments, the spacer layers 325, 327 may include main spacer layers, liner layers, and the like, as well as other spacer layers. By way of example, the spacer layers 325, 327 may be formed by conformally depositing a dielectric material over the device 300 using processes such as a CVD process, a subatmospheric CVD (SACVD) process, a flowable CVD process, an ALD process, a PVD process, or other suitable process.

The method 200 then proceeds to block 204 where inner spacers and source/drain features are formed. With reference to FIGS. 3, 4, and 4A, in an embodiment of block 204, a source/drain etch process is initially performed to the device 300 to remove the spacer layers 325, 327 and epitaxial layers 308, 310 in source/drain regions 402 of the device 300 (e.g., adjacent to and on either side of the gate stacks 316) to form trenches which expose underlying portions of the substrate 304. The source/drain etch process also serves to expose lateral surfaces of the epitaxial layers 308, 310. In some embodiments, the source/drain etch process may also remove portions of the spacer layers 325, 327 (e.g., from top surfaces of the gate stacks 316). In some cases, the spacer layer 327 may also be removed from sidewalls of the gate stacks 316. By way of example, the source/drain etch process may include a dry etching process, a wet etching process, and/or a combination thereof.

After the source/drain etch process, a dummy layer recess process is performed to the device 300. The dummy layer recess process includes a lateral etch of the epitaxial layers 308 (the dummy layers) to form recesses along sidewalls of the previously formed trenches. In some embodiments, the dummy layer recess process is performed using a dry etching process, a wet etching process, and/or a combination thereof. In some cases, the dummy layer recess process may include etching using a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch. As a result of the dummy layer recess process, the recessed epitaxial layers 308 (the dummy layers) define concave profiles 404 along opposing lateral surfaces of the epitaxial layers 308, as shown in FIG. 4A. During a later stage of processing, as discussed below, the epitaxial layers 308 (the dummy layers) will be removed and replaced by a portion of a gate structure (e.g., a metal gate structure) such that the replacement gate structure at least partially defines the concave profile. In various examples, the replacement gate structure will interface an inner spacer, as also described in more detail below.

In some cases, and as a result of the dummy layer recess process, ends of the epitaxial layers 310 in LDD regions of the device 300 (e.g., beneath the spacer layer 325 and on opposing ends of the channel region) may be partially etched such that the epitaxial layers 310 may be slightly thinner in the LDD region as compared to the channel region. By way of example, the consumption from each of the top and bottom surfaces of the epitaxial layers 310 in the LDD region, as a result of the dummy layer recess process, may be in a range of about 0.5-1 nm, for a total consumption from both top and bottom surfaces of the epitaxial layers 310 of about 1-2 nm. To be sure, in some embodiments, ends of the epitaxial layers 310 in the LDD region may not be etched during the dummy layer recess process.

After the dummy layer recess process, an inner spacer material is deposited over the device 300, within the trenches (e.g., formed by the source/drain etch process) and within the recesses (e.g., formed by the dummy layer recess process). In some embodiments, the inner spacer material may include amorphous silicon. In some examples, the inner spacer material may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. By way of example, the inner spacer material may be formed by conformally depositing the inner spacer material over the device 300 using processes such as a CVD process, a subatmospheric CVD (SACVD) process, a flowable CVD process, an ALD process, a PVD process, or other suitable process.

After deposition of the inner spacer material, an inner spacer etch-back process is performed to etch the inner spacer material from over the device 300 and along sidewalls of the trenches (e.g., formed by the source/drain etch process), while the inner spacer material remains disposed within the recesses (e.g., formed by the dummy layer recess process), thereby providing inner spacers 406 for the device 300. As shown in FIGS. 4 and 4A, the inner spacers 406 are formed in contact with the recessed epitaxial layers 308 (the dummy layers) having the concave profiles 404 such that the inner spacers 406 define a complementary convex sidewall profile 408 that interfaces the concave profile 404. As noted above, the convex profile 408 of the inner spacers 406 may degrade device performance and reduce process yield. The inner spacer etch-back process used to form the inner spacers 406 may include a wet etch process, a dry etch process, or a combination thereof. In some cases, any residual portions of the inner spacer material that remain on top surfaces of the device 300 and/or on sidewalls or bottom surfaces of the trenches (e.g., formed by the source/drain etch process), for example after the inner spacer etch-back process, may be removed during a subsequent clean process (e.g., prior to epitaxial growth of source/drain features). In various examples, the inner spacers 406 may extend beneath the spacer layer 325 (formed on sidewalls of the gate stacks 316) while being disposed adjacent to subsequently formed source/drain features, as described below. In some cases, the inner spacers 406 may extend at least partially beneath the gate stacks 316.

After formation of the inner spacers 406, source/drain features 410 are formed in the source/drain regions 402 adjacent to and on either side of the gate stacks 316 of the device 300. For example, the source/drain features 410 may be formed within the trenches (e.g., formed by the source/drain etch process) of the device 300, over the exposed portions of the substrate 304 and in contact with the adjacent inner spacers 406 and the semiconductor channel layers (the epitaxial layers 310) of the device 300. In some embodiments, a clean process may be performed immediately prior to formation of the source/drain features 410 to remove any residual portions of inner spacer material, as previously noted. The clean process may include a wet etch, a dry etch, or a combination thereof.

In some embodiments, the source/drain features 410 are formed by epitaxially growing a semiconductor material layer in the source/drain regions. In various embodiments, the semiconductor material layer grown to form the source/drain features 410 may include Ge, Si, GaAs, AlGaAs, SiGe, GaAsP, SiP, or other suitable material. The source/drain features 410 may be formed by one or more epitaxial (epi) processes. In some embodiments, the source/drain features 410 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 410 are not in-situ doped, and instead an implantation process is performed to dope the source/drain features 410.

After forming the source/drain features 410, and in some embodiments, a contact etch stop layer (CESL) 412 may be conformally formed over the device 300. In some examples, the CESL may include a silicon nitride layer, silicon oxide layer, a silicon oxynitride layer, and/or other materials known in the art. In some embodiments, an inter-layer dielectric (ILD) layer 502 may be formed over the CESL 412, as shown in FIG. 5. In various cases, the ILD layer 502 may include materials such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. In some embodiments, after formation of the ILD layer 502, the device 300 may be subject to a high thermal budget process to anneal the ILD layer 502. In some embodiments, after formation of the CESL 412 and the ILD layer 502, a chemical mechanical polishing (CMP) process may be performed to remove portions of the ILD layer 502 and the CESL 412 overlying the gate stacks 316, as well as the hard mask layers 314, 315 overlying the gate stacks 316, to planarize a top surface of the device 300 and expose a top surface of the electrode layer 322.

The method 200 then proceeds to block 206 where dummy gates are removed (e.g., as part of an RPG process). Referring to the example of FIG. 4 and FIG. 5, in an embodiment of block 206, the electrode layer 322 of the gate stacks 316 (e.g., exposed by the CMP process, as noted above) may initially be removed by suitable etching processes to form trenches 504 and expose the dielectric layer 320. Thereafter, in some embodiments, an etching process may be performed to remove the exposed dielectric layer 320 from the trenches 504. In some examples, the etching processes used to remove the electrode layer 322 and the dielectric layer 320 may include a wet etch, a dry etch, or a combination thereof.

After removal of the electrode layer 322 and the dielectric layer 320 (block 206), the method proceeds to block 208 where a channel layer release process is performed (e.g., as part of the RPG process). Referring to the example of FIGS. 5, 6, and 6A (showing an enlarged view of a portion of FIG. 6), in an embodiment of block 208, the dummy layers (the epitaxial layers 308) in the channel region of the device 300 may be selectively removed (e.g., using a selective etching process), while the semiconductor channel layers (the epitaxial layers 310) remain unetched. In some examples, selective removal of the dummy layers (the epitaxial layers 308) may be referred to as a channel layer release process (e.g., as the semiconductor channel layers are released from the dummy layers). The selective etching process may be performed through the trenches 504 provided by the removal of the dummy gate electrode. In some embodiments, the selective etching process may include a selective wet etching process. In some cases, the selective wet etching includes ammonia and/or ozone. As merely one example, the selective wet etching process includes tetra-methyl ammonium hydroxide (TMAH). In some embodiments, the selective etching process may include a dry, plasma-free etching process performed using a CERTAS® Gas Chemical Etch System, available from Tokyo Electron Limited, Tokyo, Japan.

It is noted that as a result of the selective removal of the dummy layers (the epitaxial layers 308), gaps 602 are formed between the adjacent semiconductor channel layers (the epitaxial layers 310) in the channel region. By way of example, the gaps 602 may serve to expose first portions of the epitaxial layers 310 between opposing inner spacers 406, while second portions of the epitaxial layers 310 remain covered by the inner spacers 406. It is also noted that formation of the gaps 602 exposes the convex sidewall profile 408 of the inner spacers 406 on opposing sides of the gaps 602 such that the gaps 602 define a dual concave shape, as illustrated by dashed line 604. As described in more detail below, portions of gate structures (e.g., including a metal gate stack having an interfacial layer, a high-K dielectric layer, and one or more metal electrode layers) will be formed within the gaps 602 between adjacent semiconductor channel layers (the epitaxial layers 310) and in contact with the convex sidewall profile 408 of the inner spacers 406. In at least some existing implementations, and because of the dual concave shape of the gaps 602, the portions of gate structures that are formed within the gaps 602 will thus also have the dual concave shape. As a result of the dual concave shape, which includes the convex profile 408 of the inner spacers 406 interfacing a corresponding concave sidewall profile of a metal gate structure that may be subsequently formed in the gaps 602, device performance and process yield may be degraded. Thus, it would be desirable to tune the convex sidewall profile 408 of the inner spacers 406 prior to formation of the metal gate stack.

After the channel layer release process (block 208), the method 200 proceeds to block 210 where a sheet trim process is performed. Referring to the example of FIGS. 6, 6A, 7, 7A, 7B, and 7C, in an embodiment of block 210, a sheet trim process is performed to tune the convex sidewall profile 408 of the inner spacers 406 prior to forming a gate structure (block 212). In some embodiments, the sheet trim process may include a two-step process including an ozonated deionized water ($DIO_3$) wet clean followed by a dry, plasma-free etching process performed using the CERTAS® Gas Chemical Etch System, discussed above. In some embodiments, the $DIO_3$ wet clean may be performed for about 30 s-150 s. In some cases, the dry, plasma-free etching process may be performed at about 150 mTorr, at a temperature of about 40 degrees Celsius, for a time of about 16.5 seconds, and in the presence of one or more of the following gases having the exemplary flow rates: HF (40 sccm), Ar (350 sccm), $NH_3$ (30 sccm), and $N_2$ (350 sccm). More generally, in some embodiments, the process parameters for the dry, plasma-free etching process may be defined as being within a given range. For example, the dry, plasma-free etching process may be performed at a pressure in a range of about 10-2000 mTorr, at a temperature in a range of about 10-87 degrees Celsius, for a time in a range of about 5-30 seconds, and in the presence of one or more of the following gases having the exemplary flow rate ranges: HF (10-2000 sccm), Ar (10-2000 sccm), $NH_3$ (10-2000 sccm), and $N_2$ (10-2000 sccm). By way of example, the exemplary process parameters given above are provided to ensure an appropriate etch selectivity of an oxide that may be formed on the epitaxial layers 310 (e.g., such as $SiO_2$ formed on silicon epitaxial layers 310 due to at least partial oxidation of the silicon epitaxial layers 310 by $DIO_3$) to the inner spacers 406 (e.g., which may be formed of SiCON, or other material as previously noted) to avoid losing too much inner spacer thickness. In some cases, the etch selectivity between the oxide and the inner spacers 406 may be near 1:1. If the etch selectivity between the oxide and the inner spacers 406 is not appropriately tuned, the device 300 could suffer from a metal gate extrusion defect issue. In addition, it will be understood that the parameters given for each of the wet clean and the dry, plasma-free etching process are merely exemplary, and other parameters may be used without departing from the scope of the present disclosure. In various embodiments, the sheet trim process may generally be described as being performed using a dry etching process, a wet etching process, and/or a combination thereof. In some alternative embodiments, the sheet trim process may include etching using a standard clean 1 (SC-1) solution, ozone ($O_3$), a solution of ammonium hydroxide ($NH_4OH$), hydrogen peroxide ($H_2O_2$) and water ($H_2O$), hydrofluoric acid (HF), buffered HF, and/or a fluorine ($F_2$)-based etch. In some examples, the $F_2$-based etch may include an $F_2$ remote plasma etch.

Regardless of the exact parameters of the sheet trim process (block 210), and in accordance with various embodiments, the sheet trim process disclosed herein is designed to effectively tune the convex sidewall profile 408 of the inner spacers 406 prior to forming a gate structure (block 212). In various embodiments, the sheet trim process is designed such that a middle portion of the convex sidewall profile 408 of the inner spacers 406 is consumed faster than top or bottom portions of the convex sidewall profile 408 of the inner spacers 406. As a result, and in some examples, the convex sidewall profile 408 of the inner spacers 406 becomes flattened (e.g., defining a substantially vertical plane surface). It is noted that the loss of the inner spacers 406 at top and bottom portions of the convex sidewall profile 408 may not be obvious (e.g., because the top and bottom portions of the convex sidewall profile 408 may etch more slowly than the middle portion of the convex sidewall profile 408), further providing for the substantially vertical plane surface of the inner spacer sidewall after the sheet trim process.

Various examples of the tuning of the convex sidewall profile 408 of the inner spacers 406, by the sheet trim process, are illustrated in FIGS. 7, 7A, 7B, 7C, (where FIGS. 7A, 7B, 7C show enlarged views of a portion of FIG. 7, according to different embodiments). In the examples of FIGS. 7 and 7B, the sidewall profile 408 is tuned to have a substantially vertical surface extending between respective top and bottom surfaces of adjacent epitaxial layers 310, and such that the gaps 602 define a substantially square shape, as illustrated by dashed line 704. In some embodiments, and because of the substantially square shape of the gaps 602, the gate structures subsequently formed in the gaps will thus have the substantially square shape, providing for devices 300 having improved performance and yield. Stated another way, as a result of the sheet trim process and tuning of the sidewall profile 408 of the inner spacers 406, the subsequently formed metal gate stack will have a profile that is substantially square in shape (e.g., after IL/HK and work function metal deposition). In some alternative embodiments, and as shown in the example of FIG. 7A, the sidewall profile 408 is tuned to have a substantially vertical surface that extends less than an entire distance between respective top and bottom surfaces of adjacent epitaxial layers 310 and includes at least some curved portions 706 at the top and bottom of the sidewall profile 408. However, even in the example of FIG. 7A, the gaps 602 may still define a substantially square shape, providing for a subsequently formed gate structures to also have the substantially square shape. The sidewall profile 408 of FIG. 7A may occur, in some examples, if the sheet trim process is performed for a shorter duration that the sheet trim process used to form the sidewall profile of FIG. 7B. In some cases, and as shown in the example of FIG. 7C, the sidewall profile 408 is tuned to have an at least partially concave surface. The sidewall profile 408 of FIG. 7C may occur, in some examples, if the sheet trim process is performed for a longer duration that the sheet trim process used to form the sidewall profile of FIG. 7B. It is further noted that the sheet trim process may also provide for the inner spacers 406 to have a more uniform width (e.g., from top to bottom of the inner spacers 406).

In various examples, the tuning of the sidewall profile 408 of the inner spacers 406 from convex to a substantially vertical plane surface may alternatively be described as a method for increasing a metal gate CD. Reference is made to FIGS. 8A and 8B, which illustrate top, middle, and bottom CD measurements for the gaps 602 (and the subsequent metal gate structures formed therein) for a device 300 prior to the sheet trim process (FIG. 8A) and after the sheet trim process (FIG. 8B). Due to the larger/faster consumption of the middle portion of the convex sidewall profile 408 of the inner spacers 406 (by the sheet trim process) as compared to the top and bottom portions of the convex sidewall profile 408, the gaps 602, and thus the subsequently formed metal gate stack, have their largest increase in CD near the middle portion of the inner spacers 406. Stated another way, among the top, middle, and bottom CD measurements shown in FIGS. 8A/8B, the middle CD shows the largest relative increase as a result of the sheet trim process. Merely for purposes of illustration, and in some embodiments, the consumption of the inner spacers 406, and the corresponding increment in the gap/metal gate CD, may be equal to less than about 0.5 nm near the top and bottom portions of the inner spacers 406 and may be equal to about 1.5-2 nm near the middle portion of the inner spacers 406. It is noted that without employing the sheet trim process (block 210), the consumption of the inner spacers 406 (e.g., due to the channel layer release process of block 208) may be equal to less than about 0.3 nm for each of the top, middle, and bottom portions of the inner spacers 406. As a result, without using the disclosed sheet trim process, the gaps 602, and the metal gate structures subsequently formed therein, will keep their dual concave shape and device performance and process yield may remain degraded.

The method 200 proceeds to block 212 where a gate structure is formed. The gate structure may include a high-K/metal gate stack, however other compositions are possible. In some embodiments, the gate structure may form the gate associated with the multi-channels provided by the plurality of exposed semiconductor channel layers (the exposed epitaxial layers 310, now having gaps 602 therebetween) in the channel region of the device 300. For purposes of the discussion that follows, it is assumed that the sheet trim process (block 210) resulted in the sidewall profile 408 having the substantially vertical surface extending between adjacent epitaxial layers 310, such that the gaps 602 define a substantially square shape, as shown in FIGS. 7 and 7B. Thus, with reference to the examples of FIGS. 7, 7B, and 9, in an embodiment of block 212, an interfacial layer (IL) 902 is formed on exposed surfaces of the epitaxial layers 310 (semiconductor channel layers), including on the exposed first portions of the epitaxial layers 310 within the gaps 602 and between opposing substantially vertical surfaces of the tuned sidewall profile 408 of the inner spacers 406. In some embodiments, a high-K dielectric layer 904 is formed over the IL 902. In some examples, the high-K dielectric layer 904 may also be formed on sidewalls of the spacer layer 325 and on the substantially vertical surfaces of the tuned sidewall profile 408 of the inner spacers 406. In various embodiments, the IL 902 and the high-K dielectric layer 904 may collectively define a gate dielectric of the gate structure for the device 300. In some embodiments, the gate dielectric has a total thickness of about 1-5 nm. High-K gate dielectrics, as used and described herein, include dielectric materials having a high dielectric constant, for example, greater than that of thermal silicon oxide (~3.9).

In some embodiments, the IL 902 may include a dielectric material such as silicon oxide (SiO$_2$), HfSiO, or silicon oxynitride (SiON). In some examples, the high-K dielectric layer 904 may include hafnium oxide (HfO$_2$). Alternatively, the high-K dielectric layer 904 may include other high-K dielectrics, such as TiO$_2$, HfZrO, Ta$_2$O$_3$, HfSiO$_4$, ZrO$_2$, ZrSiO$_2$, LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), combinations thereof, or other suitable material. In various embodiments, the gate dielectric may be formed by thermal oxidation, ALD, physical vapor deposition (PVD), pulsed laser deposition (PLD), CVD, and/or other suitable methods.

Figure 9:
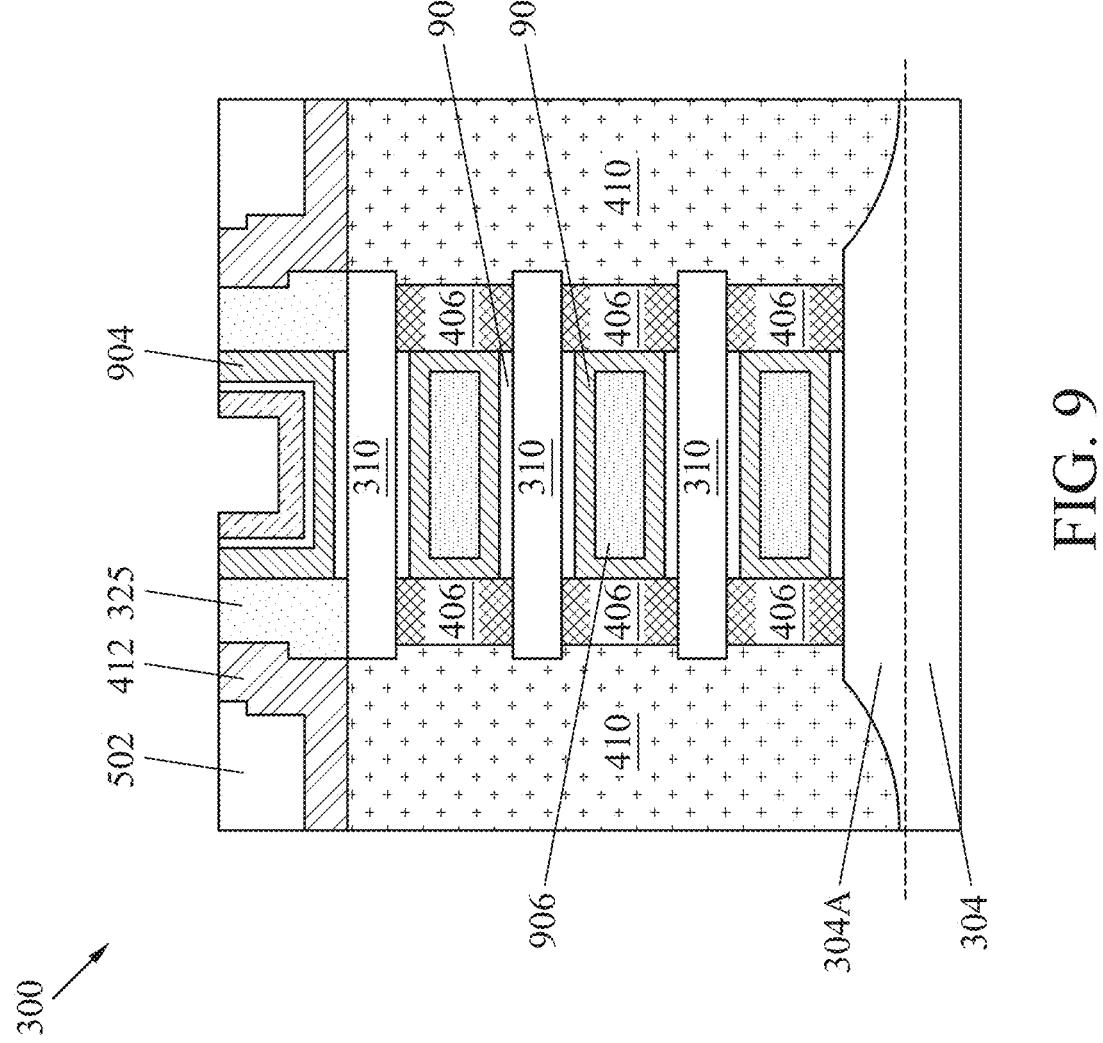
Figure 10:
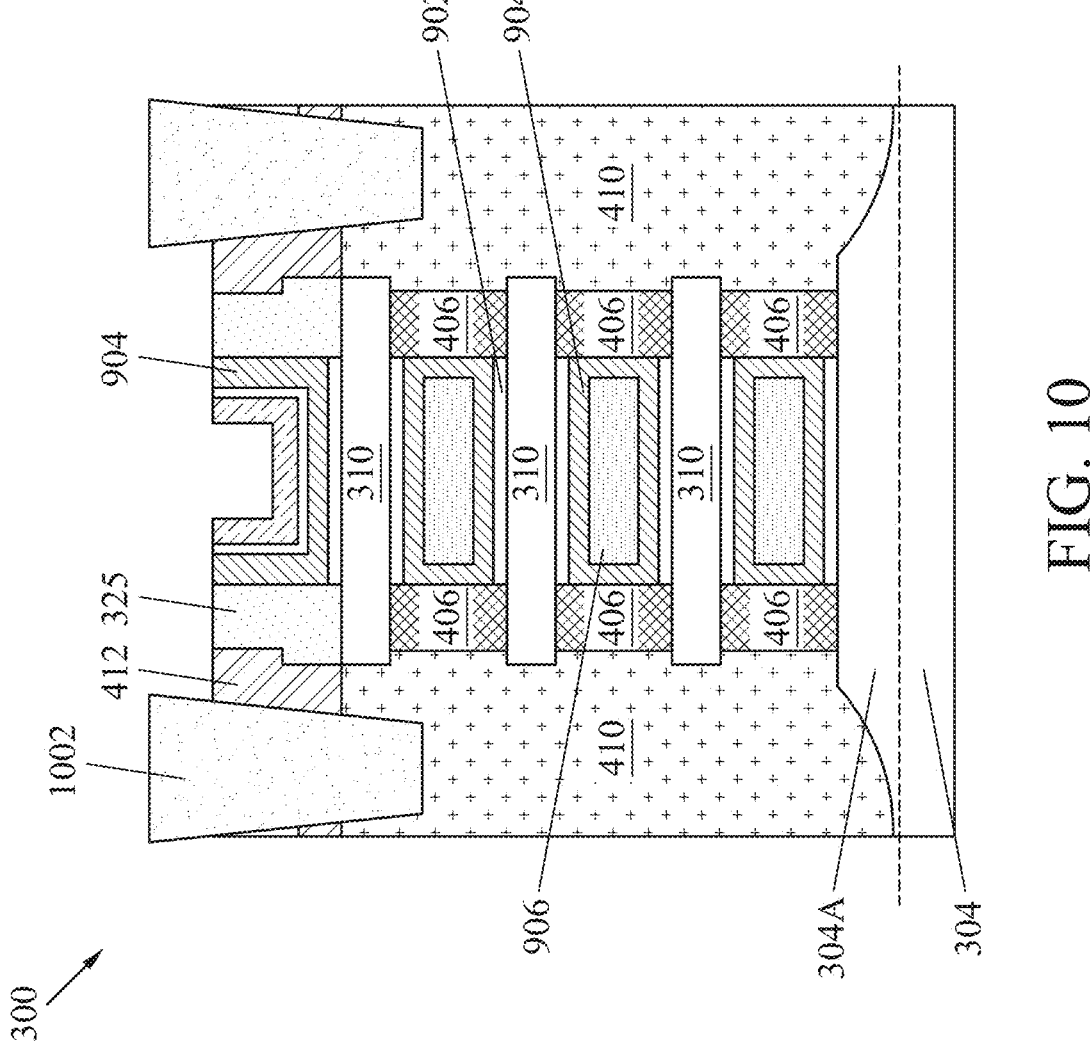

Still referring to the examples of FIGS. 7, 7B, and 9, and in a further embodiment of block 212, a metal gate including a metal layer 906 is formed over the gate dielectric (e.g. over the IL 902 and the high-K dielectric layer 904). The metal layer 906 may include a metal, metal alloy, or metal silicide. Additionally, the formation of the gate dielectric/metal gate stack may include depositions to form various gate materials, one or more liner layers, and one or more CMP processes to remove excessive gate materials and thereby planarize a top surface of the device 300.

In some embodiments, the metal layer 906 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 906 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 906 may be formed by ALD, PVD, CVD, e-beam evaporation, or other suitable process. Further, the metal layer 906 may be formed separately for N-type and P-type transistors which may use different metal layers. In addition, the metal layer 906 may provide an N-type or P-type work function, may serve as a transistor (e.g., GAA transistor) gate electrode, and in at least some embodiments, the metal layer 906 may include a polysilicon layer. With respect to the devices shown and discussed, the gate structure includes portions that interpose each of the epitaxial layers 310, which each provide semiconductor channel layers for the GAA transistors.

In various examples, the shape of the gate dielectric and the metal layer 906 of the final structure of the device 300 may vary, for example, based on the surface profile along lateral sides of the gaps 602 resulting from the sheet trim process (block 210), as discussed above with reference to FIGS. 7, 7A, 7B, 7C. In the present example of FIG. 9, and because the sheet trim process (block 210) resulted in the gaps 602 defining a substantially square shape, the metal layer 906 of will have a profile that is also substantially square in shape. Thus, the device 300 will have improved performance and yield.

The method 200 then proceeds to block 214 where source/drain contacts are formed. Referring to the example of FIG. 9 and FIG. 10, in an embodiment of block 214, an etching process may initially be performed to remove the ILD layer 502 and the CESL 412 in regions over the source/drain features 410 to form contact openings that expose the source/drain features 410. In some embodiments, the etching process may include a dry etching process, where portions of the CESL 412 remain on sidewalls of the contact openings. After formation of the contact openings, source/drain contact features 1002 may be formed within the contact openings. In some embodiments, the source/drain contact features 1002 may include a silicide layer in contact with the source/drain features 410, and a contact metal formed over the silicide layer. The silicide layer and the contact metal thus provide a low-resistance contact to the source/drain features 410 of the device 300. By way of example, the silicide layer may include TiSi, NiSi, TiN, and/or other suitable material. In some embodiments, the contact metal may include tungsten, cobalt, or other appropriate metal layer.

Generally, the semiconductor device 300 may undergo further processing to form various features and regions known in the art. For example, further processing may form various contacts/vias/lines and multilayer interconnect features (e.g., metal layers and interlayer dielectrics) on the substrate 304, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be modified, replaced, or eliminated in accordance with various embodiments of the method 200.

With respect to the description provided herein, disclosed are methods and structures for modulating a final metal gate and inner spacer profile of a multi-gate device (e.g., such as a GAA transistor), for example, during an RPG sheet formation process. In various embodiments, and prior to formation of the metal gate, the convex sidewall profile of the inner spacer may be tuned using a sheet trim process. Generally, the disclosed sheet trim process may include an ozonated deionized water (DIO$_3$) wet clean followed by a dry, plasma-free etching process. In some embodiments, the sheet trim process is designed such that a middle portion of the convex inner spacer is consumed faster than top or bottom portions of the convex inner spacer such that the convex inner spacer profile becomes flattened (e.g., defining a substantially vertical plane surface). As a result of the sheet trim process and modification of the inner spacer profile, the subsequently formed metal gate will have a profile that is substantially square in shape (e.g., after IL/HK and work function metal deposition). The disclosed sheet trim process may also provide for the inner spacer to have a more uniform width (e.g., from top to bottom of the inner spacer) while also increasing and providing a more uniform metal gate CD. The various embodiments thus provide for improved device performance (e.g., such as increased drive current, reduced DIBL, and reduced channel resistance), a wider process window for final metal gate CD control, and reduced defects, among others. Stated another way, the embodiments disclosed herein provide a tunable process to modulate a metal gate CD and metal gate profile/inner spacer profile both for device performance and yield window enhancement. Those of skill in the art will readily appreciate that the methods and structures described herein may be applied to a variety of other semiconductor devices to advantageously achieve similar benefits from such other devices without departing from the scope of the present disclosure. For example, GAA devices fabricated in accordance with the methods described herein may be used to form other types of devices and circuits such as memory devices (e.g., such as SRAM, DRAM, etc.), logic circuits, or other types of electronic devices and/or circuits.

Thus, one of the embodiments of the present disclosure described a method of fabricating a semiconductor device including providing a fin having an epitaxial layer stack with a plurality of semiconductor channel layers interposed by a plurality of dummy layers. In some embodiments, the method further includes exposing lateral surfaces of the plurality of semiconductor channel layers and the plurality of dummy layers within a source/drain region of the semiconductor device. In some examples, the method further includes etching the exposed lateral surfaces of the plurality of dummy layers to form recesses and forming an inner spacer within each of the recesses, where the inner spacer includes a sidewall profile having a convex shape. In some cases, and after forming the inner spacer, the method further includes performing a sheet trim process to tune the sidewall profile of the inner spacer such that the convex shape of the sidewall profile becomes a substantially vertical sidewall surface after the sheet trim process.

In another of the embodiments, discussed is a method that includes providing a fin structure having epitaxial layers of a first composition interposed by epitaxial layers of a second composition. In some embodiments, the method further includes forming a dummy gate over the fin structure and a spacer layer on sidewalls of the dummy gate. In some examples, the method further includes etching opposing lateral ends of the epitaxial layers of the first composition to form recesses, the recesses disposed beneath the spacer layer and between adjacent epitaxial layers of the second composition. In various embodiments, the method further includes forming inner spacers within each of the recesses on the opposing lateral ends of the epitaxial layers of the first composition, where the inner spacers on the opposing lateral ends each include a sidewall profile having a convex shape. In some cases, and after forming the inner spacers, the method further includes performing a two-step sheet trim process to modify the sidewall profile of the inner spacers such that the sidewall profile of the inner spacers on the opposing lateral ends define a substantially vertical surface after the two-step sheet trim process.

In yet another of the embodiments, discussed is a method including providing a partially fabricated device having a plurality of semiconductor channel layers interposed by a plurality of dummy layers, where inner spacers are disposed at opposing ends of each of the plurality of dummy layers and between adjacent semiconductor channel layers, and where lateral surfaces of the inner spacers in contact with the plurality of dummy layers include a convex sidewall profile. In some embodiments, the method further includes performing a channel release process to remove the plurality of dummy layers and expose the convex sidewall profile of the lateral surfaces of the inner spacers. In some examples, and after performing the channel release process, the method further includes etching a middle portion of the lateral surfaces of the inner spacers faster than top and bottom portions of the lateral surfaces of the inner spacers to change the convex sidewall profile into a substantially vertical sidewall surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   exposing lateral surfaces of an epitaxial layer stack including a plurality of semiconductor channel layers and a plurality of dummy layers;
   forming inner spacers in recesses formed at opposing lateral ends of the exposed plurality of dummy layers, the inner spacers at the opposing lateral ends having opposing sidewall profiles that define a dual concave shape therebetween; and
   performing a sheet trim process to tune the opposing sidewall profiles of the inner spacers such that the dual concave shape becomes a substantially rectangular shape.

2. The method of claim 1, wherein the sheet trim process consumes middle portions of the inner spacers faster than top or bottom portions of the inner spacers to define the substantially rectangular shape.

3. The method of claim 1, further comprising:
   after the forming the inner spacers and prior to the performing the sheet trim process, removing the plurality of dummy layers to form a gap between adjacent semiconductor channel layers and to expose the dual concave shape defined by the opposing sidewall profiles of the inner spacers at the opposing lateral ends.

4. The method of claim 3, further comprising:
   after the performing the sheet trim process, forming a metal gate structure within the gap between the adjacent semiconductor channel layers and abutting the opposing sidewall profiles of the inner spacers such that the metal gate structure defines the substantially rectangular shape.

5. The method of claim 1, wherein the sheet trim process includes a two-step process including an ozonated deionized water ($DIO_3$) wet clean followed by a dry, plasma-free etching process.

6. The method of claim 2, wherein the sheet trim process consumes about 1.5-2 nm of the middle portions of the inner spacers and less than about 0.5 nm of the top or bottom portions of the inner spacers.

7. The method of claim 2, wherein an amount of the inner spacers that is consumed during the sheet trim process corresponds to an increase in a metal gate critical dimension (CD).

8. The method of claim 1, wherein a width of the inner spacers is substantially uniform after the sheet trim process.

9. The method of claim 1, further comprising:
   after the forming the inner spacers and prior to the performing the sheet trim process, epitaxially growing source/drain features in source/drain regions adjacent to each of the inner spacers at the opposing lateral ends.

10. The method of claim 1, wherein after the forming the inner spacers and prior to the performing the sheet trim process, the opposing sidewall profiles of the inner spacers at the opposing lateral ends include convex sidewall profiles that define the dual concave shape therebetween, and wherein after the performing the sheet trim process, the opposing sidewall profiles of the inner spacers at the opposing lateral ends include substantially vertical plane surfaces that define the substantially rectangular shape.

11. A method, comprising:

forming a dummy gate over a fin structure including epitaxial layers of a first composition interposed by epitaxial layers of a second composition;

forming a spacer layer on sidewalls of the dummy gate;

forming inner spacers at opposing lateral ends of the epitaxial layers of the first composition, wherein the inner spacers are disposed beneath the spacer layer on the sidewalls of the dummy gate and between adjacent epitaxial layers of the second composition; and after the forming the inner spacers, performing a multi-step sheet trim process to modulate opposing sidewall profiles of the inner spacers at the opposing lateral ends.

12. The method of claim 11, further comprising:

prior to the forming the inner spacers, etching the opposing lateral ends of the epitaxial layers of the first composition to form recesses; and forming the inner spacers within the recesses.

13. The method of claim 11, wherein after the forming the inner spacers and prior to the performing the multi-step sheet trim process, the opposing sidewall profiles of the inner spacers at the opposing lateral ends have a convex shape.

14. The method of claim 11, wherein after the performing the multi-step sheet trim process, the opposing sidewall profiles of the inner spacers at the opposing lateral ends have a substantially vertical surface.

15. The method of claim 14, wherein the substantially vertical surface of the opposing sidewall profiles of the inner spacers extends between respective top and bottom surfaces of adjacent epitaxial layers of the second composition.

16. The method of claim 14, wherein the substantially vertical surface of the opposing sidewall profiles of the inner spacers extends less than an entire distance between respective top and bottom surfaces of adjacent epitaxial layers of the second composition.

17. The method of claim 11, wherein the multi-step sheet trim process consumes a middle portion of the inner spacers faster than top or bottom portions of the inner spacers.

18. A method, comprising:

providing a semiconductor device including an epitaxial layer stack of epitaxial layers of a first composition and epitaxial layers of a second composition, the epitaxial layer stack including inner spacers disposed at opposing ends of the epitaxial layers of the first composition, and wherein lateral surfaces of the inner spacers in contact with the epitaxial layers of the first composition include a convex sidewall profile; and after performing a channel release process to remove the epitaxial layers of the first composition and expose the convex sidewall profile, removing a middle portion of the lateral surfaces of the inner spacers faster than top and bottom portions of the lateral surfaces of the inner spacers to modify a shape of the convex sidewall profile.

19. The method of claim 18, wherein the shape of the convex sidewall profile is modified into a substantially vertical sidewall profile.

20. The method of claim 18, wherein the performing the channel release process forms a gap between adjacent ones of the epitaxial layers of the second composition, and wherein after the removing the middle portion of the lateral surfaces of the inner spacers faster than the top and bottom portions of the lateral surfaces of the inner spacers, the gap defines a substantially rectangular shape.

* * * * *